(12) United States Patent
Schrank et al.

(10) Patent No.: US 8,530,914 B2
(45) Date of Patent: Sep. 10, 2013

(54) OPTOELECTRONIC COMPONENTS WITH ADHESION AGENT

(75) Inventors: Franz Schrank, Raab (AT); Peter Pachler, Graz (AT)

(73) Assignees: TridonicAtco Optoelectronics Gmbh, Jennersdorf (AT); Lumitech Produktion und Entwicklung GmbH, Jennersdorf (AT)

( * ) Notice: Subject to any disclaimer, the term of this patent is extended or adjusted under 35 U.S.C. 154(b) by 0 days.

(21) Appl. No.: 11/994,972

(22) PCT Filed: Jun. 8, 2006

(86) PCT No.: PCT/EP2006/005506
§ 371 (c)(1), (2), (4) Date: Mar. 11, 2008

(87) PCT Pub. No.: WO2007/006378
PCT Pub. Date: Jan. 18, 2007

(65) Prior Publication Data
US 2008/0203413 A1 Aug. 28, 2008

(30) Foreign Application Priority Data

Jul. 8, 2005 (DE) .................. 10 2005 032 078
Aug. 16, 2005 (DE) .................. 10 2005 038 698

(51) Int. Cl.
*H01L 33/00* (2010.01)

(52) U.S. Cl.
USPC ............... 257/96; 257/E25.032; 438/26

(58) Field of Classification Search
USPC ............... 257/98, E25.032; 438/26
See application file for complete search history.

(56) References Cited

U.S. PATENT DOCUMENTS

| | | | |
|---|---|---|---|
| 5,187,547 A | 2/1993 | Niina et al. | |
| 5,959,316 A * | 9/1999 | Lowery | 257/98 |
| 6,204,523 B1 | 3/2001 | Carey et al. | |
| 6,504,301 B1 | 1/2003 | Lowery | |
| 6,590,235 B2 | 7/2003 | Carey et al. | |
| 6,596,369 B2 * | 7/2003 | Ottinger et al. | 428/66.4 |
| 2002/0070449 A1 * | 6/2002 | Yagi et al. | 257/734 |
| 2003/0152764 A1 * | 8/2003 | Bunyan et al. | 428/328 |
| 2003/0156425 A1 * | 8/2003 | Turnbull et al. | 362/545 |

(Continued)

FOREIGN PATENT DOCUMENTS

| | | |
|---|---|---|
| DE | 19807086 | 8/1999 |
| DE | 19905697 | 8/2000 |

(Continued)

OTHER PUBLICATIONS

International Search Report for PCT/EP2006/005506 dated Aug. 31, 2006.

*Primary Examiner* — Thao Le
*Assistant Examiner* — Matthew Gordon
(74) *Attorney, Agent, or Firm* — Marshall, Gerstein & Borun LLP

(57) ABSTRACT

$SiO_2$ layers are used as adhesion layers in the case of optoelectronic components. Durable adhesions can be produced with silicone rubbers. These materials normally have only an insufficient adhesive strength on materials as frequently used for optoelectronic components, such as LED modules. This then leads in further consequence to a clear reduction of the operating life of the manufactured components. These restrictions are avoided effectively by the use of the adhesion layers, endurance upon operation in damp surroundings and upon temperature change loading is substantially improved.

15 Claims, 3 Drawing Sheets

(56) References Cited

U.S. PATENT DOCUMENTS

| | | |
|---|---|---|
| 2004/0069999 A1* | 4/2004 | Lin et al. .................... 257/88 |
| 2004/0072383 A1* | 4/2004 | Nagahama et al. .......... 438/47 |
| 2004/0082199 A1* | 4/2004 | Cheung et al. ............. 438/789 |
| 2004/0090180 A1* | 5/2004 | Shimizu et al. ............. 313/512 |
| 2004/0115873 A1* | 6/2004 | Chen et al. ................. 438/200 |
| 2004/0256974 A1* | 12/2004 | Mueller-Mach et al. ..... 313/485 |
| 2005/0093004 A1* | 5/2005 | Yoo ............................. 257/79 |
| 2005/0253213 A1 | 11/2005 | Jiang et al. |
| 2006/0202105 A1* | 9/2006 | Krames et al. ............ 250/208.1 |
| 2006/0261364 A1 | 11/2006 | Suehiro et al. |

FOREIGN PATENT DOCUMENTS

| | | |
|---|---|---|
| DE | 10261908 | 7/2004 |
| EP | 1 267 423 | 2/2002 |
| EP | 1 249 874 | 10/2002 |
| EP | 1 347 517 | 9/2003 |
| EP | 1 475 846 | 11/2004 |
| JP | 1 222555 | 8/1999 |
| JP | 2002 198570 | 7/2002 |
| JP | 2003 249691 | 9/2003 |
| WO | WO-2004/082036 | 9/2004 |
| WO | WO-2004/109813 | 12/2004 |

* cited by examiner

OPTOELECTRONIC COMPONENTS WITH ADHESION AGENT

BACKGROUND OF THE INVENTION

LED modules in COB technology (COB=chip on board) are sealed mostly with cover resins based on epoxy resins. Such modules are for example known from EP 1347517 and EP 1352431. Although the use of silicones is mentioned in the patent claims (e.g. also in EP 1347517) such modules are not yet used in practice. The main reason for this is the known insufficient adhesive force of these silicone materials.

There are also known modules with adhered on lenses; also here there are preferably used as adhesives systems based on epoxides. These materials normally develop a very good adhesive force. However, a significant disadvantage of the epoxides is their restricted endurance in the use of blue LEDs. The emitted light of a wavelength of ca. 460 nm leads to a rapid yellowing of these resins, which in turn leads to a fall-off of the brightness of the LED modules. On operation in damp surroundings only an insufficient dampness protection is provided for the component by the epoxide, the endurance in the case of temperature change loading is unsatisfactory.

Besides the configurations described above numerous further constructions are known for LED modules and luminaires. In some of these configurations silicones are again mentioned as casting materials or filler materials. By way of example attention is directed to the patents U.S. Pat. Nos. 6,504,301, 6,590,235, 6,204,523 and DE 10261908. In none of these documents, however, is the adhesion of the silicones on the materials used discussed. In some of the described constructions the mechanical stability of the structure is ensured by additional structural measures (e.g. in U.S. Pat. No. 6,504,301).

In other configurations, however, silicone gels are put to use, but due to their nature can afford no mechanical protection for the semiconductor and its bonding wires. A gel can therefore always only be used in connection with other structural measures.

In the use of epoxides as a casting resin for photodiodes, e.g. as optical sensor in air conditioning controllers, the insufficient light-fastness of the resins is also a limiting factor for the operating life.

SUMMARY OF THE INVENTION

The invention provides an improved assembly connection in the field of optical components, in particular LEDs.

Accordingly, the invention provides an LED luminaire, having an LED chip, mounted on a carrier, wherein for the assembly of the LED luminaire there is provided an optically transparent adhesion layer of $SiO_2$ between at least a partial region of the surface of the carrier and/or the LED chip and a cover or adhesion of silicone material, wherein the adhesion layer has a thickness in the region of 100 nm, preferably 20 nm or less.

Further, the invention provides an optoelectronic component mounted on a carrier and an optically transparent adhesion layer of $SiO_2$ between at least a partial region of the surface of the carrier and/or the LED chip and a cover or adhesion.

Also, the invention provides a method for the production of an optoelectronic module, comprising:
  mounting an optoelectronic component on a carrier,
  applying an $SiO_2$ layer as adhesion agent on a partial region or on the complete surface of the top side of the carrier and/or the component, and
  applying an adhesion or cover on the $SiO_2$ layer.

Summarized, the background of the invention is to be understood as follows: Different methods for the deposition of thin $SiO_2$ layers are known. The plasma deposition of such layers is described in DE 198 07 086, for example. Likewise there is known the technique of using flamed on $SiO_2$ layers for the provision of adhesion. Such a configuration is described in DE 199 05 697 A1.

In accordance with the invention such adhesion layers are used for the first time in the case of optoelectronic components. Therewith, durable adhesions can be produced with silicone rubbers. These materials normally have only an insufficient adhesive strength on materials as frequently used for optoelectronic components, such as LED modules. This then leads in a further consequence to a significant reduction of the operating life of the manufactured components. Through the use of the adhesion layers these restrictions are effectively avoided, the endurance upon operation in damp surroundings and upon temperature change loading is improved substantially.

Thus the invention does not relate to $SiO_2$ in a LED chip itself, but outside the chip, namely as an adhesion agent in the assembly of the chip, when these LED chips are further processed to luminaires.

BRIEF DESCRIPTION OF THE DRAWINGS

The invention will now be explained in more detail with reference to exemplary embodiments and the accompanying Figures.

DETAILED DESCRIPTION

Figure 1:
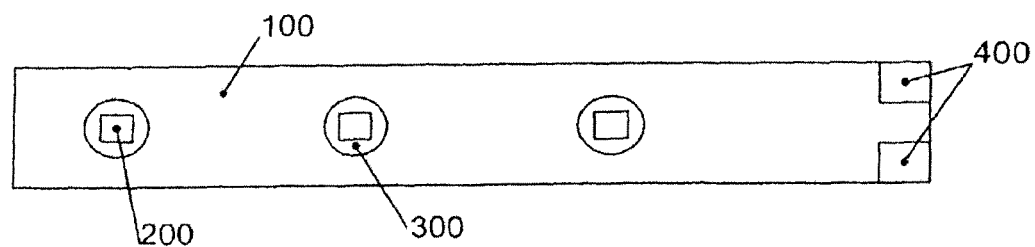
FIG. 1 thereby shows a module with a cover resin.

In FIG. 1 there is illustrated in a view from above an LED module with a cover resin. In a favorable configuration the cover is formed hemispherical, centrally over the LED dice. The LED dice 200 are adhered to or soldered on the carrier material 100 (e.g. circuit board based on FR4). The cover resin 300 is applied in liquid form and then hardened. For contacting there are usually used solderable terminal pads 400.

Figure 2:
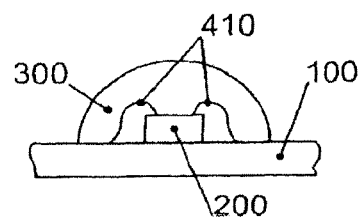
FIG. 2 is a detail from this module according to FIG. 1, in a sectional view.

In FIG. 2 there is illustrated, in sectional view, a detail from this module according to FIG. 1. The carrier material 100, the dice 200 and the cover resin 300 is thereby as illustrated in FIG. 1. In this illustration to an enlarged scale there are illustrated the bonded connection wires 410 by means of which the dice 200, which is mounted with COB technology (Chip-on-board), is contacted electrically with the carrier (circuit board) 100.

Figure 3:
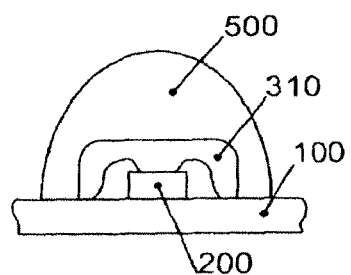
FIG. 3 is a corresponding detail of a module with emplaced lens.

In FIG. 3 there is illustrated a corresponding detail of a module with an emplaced lens 500. The adhesion is thereby effected with a reaction resin 310, which fills out the space between the lens 500 and the dice.

According to the state of the art there may be contained in the cover resins, for provision of white light emission, a so-called phosphorescing luminescent material (as described e.g. in EP 1347517) which for example converts a part of the light radiated by an LED to another wavelength range so that the mixture yields a substantially white light. In the case of adhered on lenses this luminescent material can in addition or alternatively be used in the adhesive employed.

Figure 4:
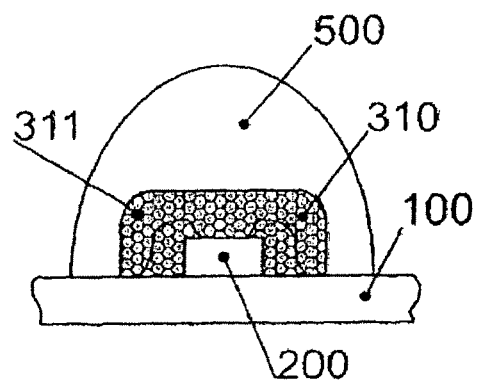
FIG. 4 is a sectional view of a further module.

Such a construction is outlined in FIG. 4. In the lens there is thereby preferably provided a defined cavity which is filled with the adhesive 310. The luminescent material 311 is dispersed in this adhesive 310.

$SiO_2$ adhesion layers are put to use for improvement of the adhesion of the silicones to the materials employed. In principle all known methods for layer deposition can be used.

The adhesion layers preferably have a thickness of a few nm (10-9 m).

By means of a corresponding process control these layers can be deposited on plastics (coatings and solder resists of the carrier), on metals (electrical connections, carrier or parts of the carrier), on the LED dice and also on the emplaced lenses (plastics such as polyacrylate, PMMA or COC, and glasses). The process of the coating can be so carried out that a good and long term stable adhesion of the deposited $SiO_2$ layer is obtained on all aforementioned materials. It is, however, decisive that silicone materials applied on the adhesion layers after effected polymerization have very good adhesive strength values.

Figure 5:
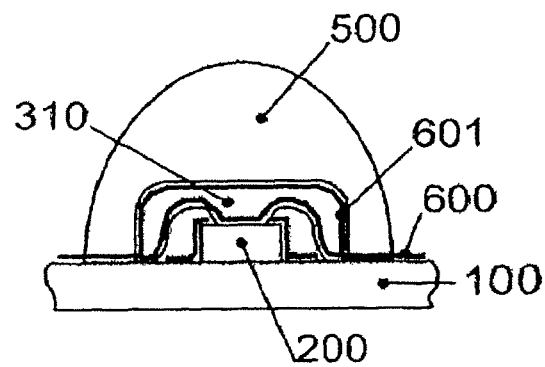
FIG. 5 shows a module in accordance with the invention.

In the following, by way of example, measurement values of embodiments in accordance with the invention will be indicated. In FIG. 5 a drawing of such a module is illustrated. An LED dice 200 is applied on the carrier 100. After electrical contacting with the connection wires 410 the adhesion layer 600 (illustrated greatly enlarged) is deposited on the complete surface. This adhesion layer may be an $SiO_2$ layer for example. Check measurement of the brightness of the LED dice 200 shows that neither the thermal loading due to the deposition process nor the layer itself leads to a diminution of the emitted light. In numerous series of measurements no change of the average value was found after the layer deposition.

On the dice 200 there is then applied a reaction resin 310, for example on silicone basis, such that the adhesion providing layer lies between the silicone material and the dice 200 or the carrier 100.

Over the LED dice 200 a lens 500 is then adhered on. Before the adhesion with the reaction resin 310 (for example on silicone basis) there is deposited on the underside of the lens 500 towards the dice 200 an adhesion layer 601, for example a $SiO_2$ layer (in turn illustrated greatly enlarged).

An adhesion providing layer can thus be provided between the cover (lens) 500 and the reaction resin and/or the reaction resin and the dice 200 and the carrier. Preferably but not obligatorily the adhesion providing layer is present over the complete contact surface.

The geometric form and the material of the carrier 100 are not limited to the above-described configuration. The carrier can be a circuit board of FR4, metal or ceramic.

Likewise, the carrier may be of a plastic material (Thermoplast or Duroplast). A so-called lead frame, molded round with plastic, can likewise be used.

For assessment of the adhesive strength the shear off forces were determined. In comparison measurements the adhesive strengths were determined also after a temperature change test. By way of example here the results of such a test with glass lenses adhered on FR4 are given. The given numerical values indicate that (average) load in [g] which leads to a detachment of the applied lens.

a.) Without adhesion layers: 1200 after TW: 1000
b.) adhesion layer on FR4: 5600 after TW 4900
c.) adhesion layer on FR4 and glass: 9700 after TW 9700
(TW=temperature change test.)

Also similar test setups were produced with plastic lenses. It is found that the material of the lens does not influence the adhesive strength; the quality and the adhesion of the deposited $SiO_2$ layer are decisive. The quality of the adhesion layer can easily be determined in the visual analysis of the test subjects after the shear off test. In the case of "good" adhesion layers the silicone rubber tears; the adhesive joint does not fail.

Figure 6A:
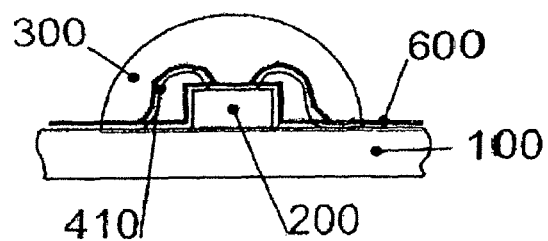
FIGS. 6a, 6b show sectional views of further modules in accordance with the invention.
Figure 6B:
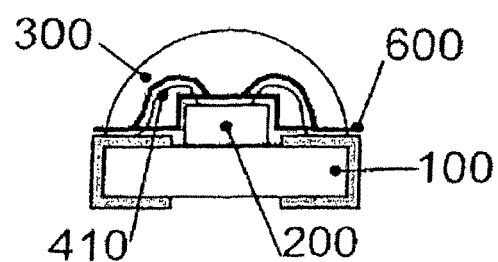

Similarly good results are achieved in the testing of modules according to FIG. 6 (6a shows a COB version, 6b shows an SMT version). The adhesion layer 600 is preferably, as in the above example, deposited on the complete surface, i.e. on the carrier 100, the LED dice 200 and if applicable the connection wires 410. Thus the complete top side of the optoelectronic component including the side surfaces is covered with an adhesion layer.

(Alternatively the adhesion layer 600 may be present only on one of carrier 100 and dice 200 or on partial regions thereof, wherein the partial regions carrier and dice can overlap.)

By means of dispensing the liquid silicone is then applied in form of a hemisphere 300. After the polymerization of the silicone rubber, for assessment of the adhesion of the cover material, a dampness test and a temperature shock test are used for indirect testing. In a direct comparison in the dampness test 85° C. and 85% relative humidity, an epoxide used currently gives, after 600 h, a reduction of the brightness to 50 to 70% of the initial value; a second epoxide, also used in production, has after this test duration merely only 20% of the initial brightness, whereby also some total failures occur. On the other hand, corresponding modules constituted in accordance with the invention have after a 600 h test duration still more than 90% of the initial brightness.

In the temperature shock test –40° C./105° C., in the case of covers of silicone rubber no failure was to be observed after 3000 cycles. Although there is no direct comparison here, it is nevertheless to be noted that in the case of older temperature change tests with covers of epoxides, first failures have always appeared after 500 cycles at the latest.

These results demonstrate in impressive manner that with the aid of these adhesion layers silicone rubbers constitute—without any further constructive measures—a firm connection to the materials employed. The adhesive strength is decreased neither by higher temperature nor by dampness. Moreover, the adhesions also have no sensitivity with regard to temperature change loading. It is important that the silicones must contain no bonding agents or similar additives. Therewith, all optically transparent materials can be put to use. Such rubbers are offered by several manufacturers.

Some of these commercially available silicones also fulfill the requirements with regard to resistance to UV irradiation. The most resistant materials show no yellowing after 5000 h in continuous operation with blue LEDs (ca. 460 nm dominant wavelength). According to the results of the irradiation tests (UVC radiation, 30 mW/cm2), where after some hundred hours no reduction of the transparency is ascertainable, also after 20000 hours and more in continuous operation no yellowing of the silicone over the blue LED should appear.

The invention claimed is:

1. Optoelectronic component comprising:
    an optoelectronic component part having a surface mounted on a surface of a carrier;
    an optically transparent adhesion layer of $SiO_2$ covering and in direct contact with at least a portion of the surface of the carrier and covering the complete top side and a side surface of the optoelectronic component part, wherein the adhesion layer has a thickness of 100 nm or less; and
    a hemispherical cover of silicone material applied on the adhesion layer, wherein the cover of silicone material is in direct contact with the adhesion layer.

2. Optoelectronic component according to claim 1, wherein the optoelectronic component part is a light emitting diode chip.

3. Optoelectronic component according to claim 1 wherein the carrier is a circuit board.

4. Optoelectronic component according to claim 3, wherein the optoelectronic component part is mounted on the circuit board with a Chip-on-Board technique.

5. Optoelectronic component according to claim 1, comprising a lens adhered over the optoelectronic component part by the adhesive layer and wherein the adhesive layer is based on silicone.

6. Optoelectronic component according to claim 2, wherein the wavelength of the emitted light lies between, inclusively, the UV region and, inclusively, the IR region.

7. Optoelectronic component according to claim 1, wherein the silicone material comprises a luminescent material.

8. Optoelectronic component according to claim 1, wherein the silicone material comprises at least one filler.

9. Optoelectronic component according to claim 8, wherein the filler is selected from the group consisting of silicic acids, granular $Al_2O_3$, and $BaSO_4$.

10. Optoelectronic component according to claim 1, wherein the optoelectronic component part is a photodiode.

11. Optoelectronic component according to claim 1, constructed in Surface Mounted Technology or a radial manner.

12. Optoelectronic component in accordance with claim 1, wherein the adhesion layer has a thickness of 10 nm or less.

13. Optoelectronic component according to claim 1, wherein the adhesion layer has a thickness of 20 nm or less.

14. Optoelectronic component according to claim 1, wherein the silicone material is polymerized after being applied to the adhesion layer.

15. Method for the production of an optoelectronic component, comprising:
    mounting an optoelectronic component part on a carrier having a top side,
    applying an $SiO_2$ layer as an adhesion agent on and in direct contact with a part region or on the complete surface of the top side of the carrier and on and in direct contact with the complete top side and the side surface of the component part, wherein the adhesion layer has a thickness of 100 nm or less, and
    applying a hemispherical cover of silicone material on the $SiO_2$ layer, wherein the cover of silicone material is in direct contact with the $SiO_2$ layer.

* * * * *